United States Patent [19]

Weglin

[11] 4,017,968
[45] Apr. 19, 1977

[54] METHOD OF MAKING PLATED THROUGH HOLE PRINTED CIRCUIT BOARD

[75] Inventor: Walter Weglin, Bellevue, Wash.

[73] Assignee: Jerobee Industries, Inc., Redmond, Wash.

[22] Filed: Sept. 18, 1975

[21] Appl. No.: 614,533

[52] U.S. Cl. .................................. 29/625; 29/626; 29/628; 174/68.5; 427/96; 427/97
[51] Int. Cl.² .......................................... B41M 3/08
[58] Field of Search ............ 29/625, 626, 624, 628, 29/581, 580; 174/68.5; 204/14 R, 14 N, 15, 29, 32 R, 38 R; 427/96, 97, 98

[56] References Cited

UNITED STATES PATENTS

| 2,716,268 | 8/1955 | Steigerwalt | 29/625 |
| 2,958,120 | 11/1960 | Taylor | 29/625 |
| 3,354,543 | 11/1967 | Lawrence et al. | 29/625 |
| 3,436,513 | 4/1969 | Harris | 29/626 |
| 3,654,097 | 4/1972 | Degnan | 29/625 X |
| 3,702,284 | 11/1972 | Merkenschlager | 204/15 |
| 3,873,429 | 3/1975 | Brown | 29/625 X |

OTHER PUBLICATIONS

Coombs, Printed Circuits Handbook, McGraw-Hill, 1967, pp. 4-19, 5-10.

Primary Examiner—James R. Duzan
Attorney, Agent, or Firm—Graybeal, Barnard & Uhlir

[57] ABSTRACT

A circuit board having through hole connections between circuit elements on opposite sides of the board. Each through hole has its end portions countersunk, with peripheral portions of the circuit element depressed into the countersink area. A layer of conductive material is plated in the wall of each hole, with the conductive material overlapping the circuit element material that is depressed into the countersink.

In the method of the present invention, a resist coating is applied uniformly over both planar surfaces of a circuit board on which the circuit elements have already been formed. The portions of the circuit elements contacting the edge portions of the through holes in the board are mechanically depressed into the substrate to form the countersink areas. Thereafter a coating is applied, either by an electroless process or electrolytically to form the plated through hole connection.

23 Claims, 29 Drawing Figures

METHOD OF MAKING PLATED THROUGH HOLE PRINTED CIRCUIT BOARD

BACKGROUND OF THE INVENTION

1. Field of the Invention

The present invention relates to single sided, double sided and multi-layer circuit boards wherein conductive holes are formed through the board for electrical connection between elements at different levels of the board.

2. Description of the Prior Art

In recent years, circuit board technology has become more sophisticated, with greater emphasis on closer spacing of the circuit elements on the board. When circuit elements are placed on both sides of the board or at different levels of the board, it is usually necessary to make a large number of "through hole" connections from one side of the board to the other. In a mass production operation, this must be done in a manner that is compatible with the manufacturing techniques for making the circuit boards, and in a manner that the through hole connections are made reliably.

For a high production operation, it has generally been found impractical to form a through hole connection by physically inserting a conductive element in a hole and then connecting the element to two circuit elements by soldering or other means. Therefore, plating techniques have been used in the prior art to make such connections. The usual method of accomplishing this is to plate the circuit elements and the through hole connections simultaneously so that the through hole connection is essentially made as an integral part of circuit elements on different levels of the board.

One method of accomplishing this in the prior art is by means of an "additive process", in which a dielectric substrate is selected with a porous surface which readily accepts deposition of a conductive material by an electroless process. Prior to placing any conductive material on the substrate, holes are drilled through the substrate in the appropriate locations, and the entire surface of the substrate, including the walls of the drilled holes, is sensitized, this being usually accomplished by dipping the substrate in a sensitizing solution. Next, a resist material is applied to both surfaces of the substrate, in a manner to leave exposed the surface areas of both sides of the substrate which are to be formed with conductive elements. Then the substrate is dipped into an electroless plating solution, until sufficient conductive material (e.g. copper) is deposited on the exposed sensitized areas of the board to form the circuit elements and the related through hole connections as continuous plated material.

Another prior art method of forming the circuit elements and the through hole connections together is by an electrolytic plating process. As in the additive process, a special dielectric substrate is provided that is adapted to receive an electroless coating of conductive material. The substrate is drilled with holes in the appropriate locations, and the entire substrate surface, including the walls of the drilled holes, is sensitized. Then the entire surface of the board is electrolessly plated (including the walls of the holes) with a very thin conductive coating (e.g. 30 millionths inch thick). Next, a protective coating is placed on the two surfaces of the substrate, in accordance with the pattern of the circuit elements to be formed, with the surface portions of the substrate on which circuit elements are to be formed being exposed. After this, a conductive material is electrolytically plated on the exposed portions of the substrate, so as to form circuit elements connected integrally with through hole plating material to make the through hole connection. Subsequently, the resist material is stripped away from the board substrate, and the board is then subjected to an etching solution for a short period, just sufficient to remove the very thin electrolessly plated areas that had been protected by the resist. This general process is described in U.S. Pat. No. 3,568,312, Perricone.

In the processes described above, it is necessary to apply the protective coating (i.e., resist) in accordance with a predetermined pattern so that certain surface areas on the substrate are exposed as well as the surface areas of the hole walls. Thus, either all of the circuit elements or a portion of the circuit elements on the two surfaces of the board are also formed by the plating process. Since the conductive material that is deposited either electrolessly or electrolytically is more expensive per unit weight of material than conductive material formed from a foil sheet on the substrate (either by an etching technique or by die stamping), it is desirable to accomplish the reliable plating of conductive through holes in a manner to minimize the necessity of forming circuit elements on the surface of the board by the plating technique.

Generally representative of the prior art in this area are the following U.S. Pat. Nos.: Coe et al, 3,261,769; McNutt, 3,268,653; Nagy et al, 3,357,099; Hirohata et al, 3,391,455; Freehauf et al, 3,429,036; Johnson, 3,457,638; Hirohata et al, 3,506,482; Grunwald et al, 3,620,933; and Stahl et al, 3,625,758.

SUMMARY OF THE INVENTION

The preferred form of the method of the present invention provides a means of making a through connection between circuit elements on opposite sides of a circuit board. In this method, there is provided in the circuit board a through hole which extends through both circuit elements on opposite sides of the board and through the substrate to which the circuit elements are bonded. Portions of the two circuit elements adjacent the hole are formed into the hole in a manner to make first and second inwardly flared circuit element portions that extend from the upper and lower planes, respectively, of the substrate into the hole, and covering the first and second planar surfaces of the board with a plating resist material, while maintaining as exposed areas, the inwardly flared circuit element portions and the hole area therebetween. Then these exposed areas of the board are plated to make a through hole connection having a middle portion extending through the hole and two end portions overlapping and connecting electrically to the inwardly flared circuit element portions.

In one embodiment of the present invention, the through hole connection is made by an electroless plating process, where a sensitizing coating is applied to the exposed areas of the circuit board subsequent to forming the through hole and prior to applying the resist coating. After the resist coating is applied, the board is placed in an electroless plating solution to form the through hole connection.

In accordance with a second embodiment, the through hole connection is made by an electrolytic plating process. In this embodiment, after the through hole is formed and prior to applying the resist material, a sensitizing coating is applied to the exposed areas of the board, a thin conductive coating is electrolessly plated on the exposed surface areas of the board, and first and second circuit element portions are formed into the hole area. Then the resist coatings are applied to the planar surfaces of the board, after which the board is subjected to an electrolytic plating process, with the conductive material being formed on the exposed hole area and the two adjacent inwardly flared circuit element portions to form the through hole connection.

In accordance with the third and fourth embodiments of the present invention, the inwardly flared circuit element portions are made prior to forming the through hole. Also, the method of the present invention is disclosed as applied to multi-layer circuit boards.

The circuit board of the present invention comprises a substrate having circuit elements on both sides of the board. Where there is a through hole connection between circuit elements directly opposite each other on the board, portions of the circuit elements adjacent the connection are flared inwardly toward the hole. The connection itself comprises a middle tubular portion and two outwardly flared portions which overlap adjacent inwardly flared portions of the circuit elements between which the electrical connection is being made.

Other facets of the present invention will become apparent from the following detailed description.

DESCRIPTION OF THE PREFERRED EMBODIMENTS

Figures 1, 1A, 2, 3, 4, 5, 6:
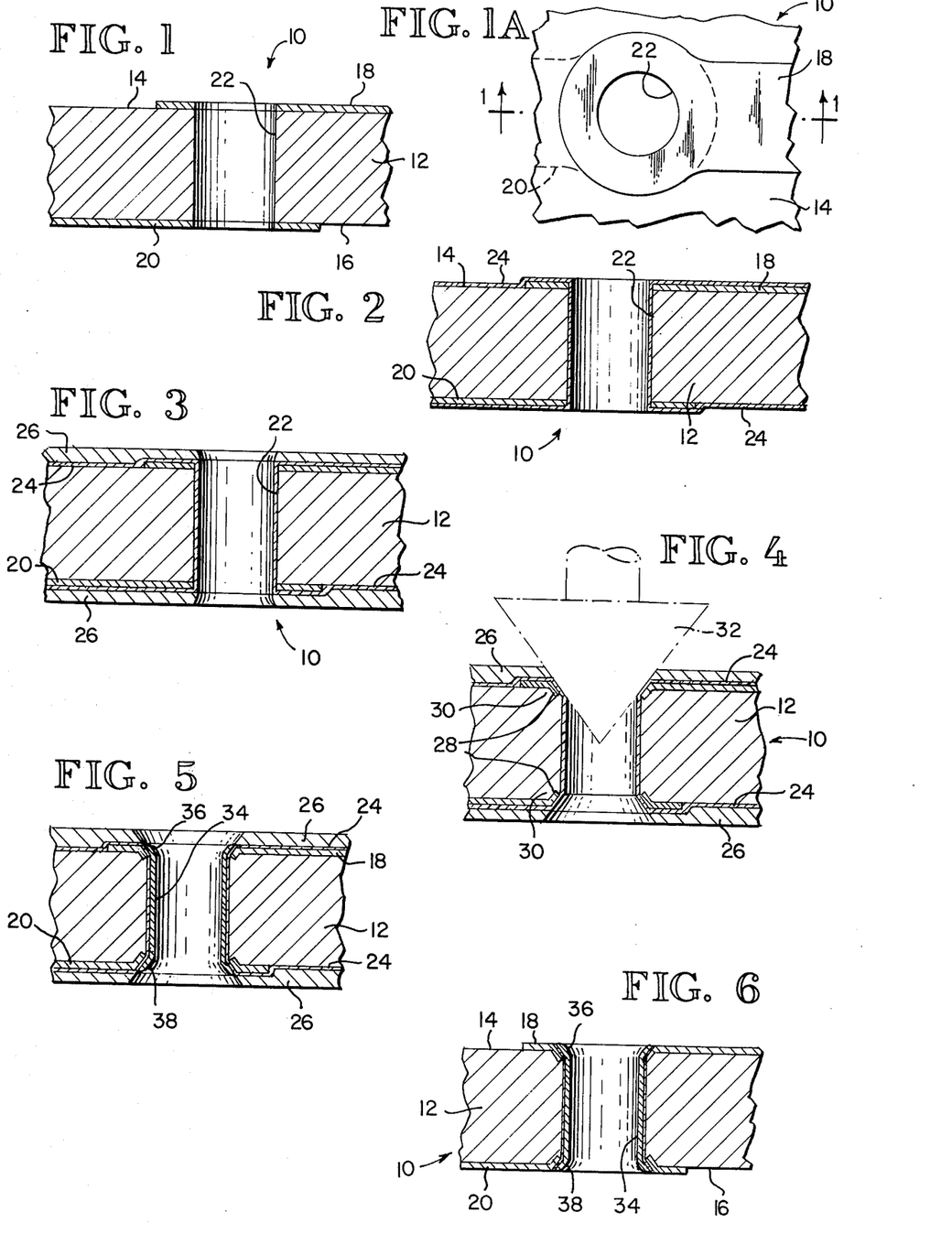
FIGS. 1–6 are each a cross sectional view of one portion of a circuit board, illustrating the sequence of steps of a first embodiment of the method of the present invention where a conductive through hole connection is being made, with FIG. 1A showing that portion of the circuit board in plan view.
FIG. 1A is a plan view of the board of FIG. 1.
Figure 7:
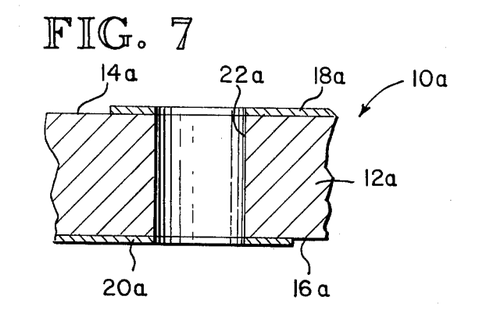
FIGS. 7–12 are a second set of views, similar to FIGS. 1–6, but showing the sequence of steps in a second embodiment of the present invention.

With reference to FIG. 1, there is shown a small portion of a circuit board 10, made up of a dielectric substrate 12 having upper and lower planar surfaces 14 and 16, to which are bonded a plurality of circuit elements, one upper circuit element being shown at 18 and a lower circuit element being shown at 20. The dielectric substrate 12 is made of a fiber board material, fiberglass, or some other suitable material which will yield moderately under high unit pressure. The foil elements 18 and 20 are made of a thin metal material, usually copper, from one to several thousandths of an inch thick. While only two circuit elements 18 and 20 are illustrated in the drawing, it is to be understood that ordinarily there are a large number of such circuit elements on both the upper and lower substrate surfaces 14 and 16. Also, it is to be understood that in a mass production operation, it is usually necessary to make a large number of through hole electrical connections between circuit elements on the upper and lower surfaces of the substrate 12.

The circuit board 10, with the circuit elements, such as those shown at 18 and 20, formed in the proper configuration and bonded to the substrate 12, can be made by one or more of the methods known in the prior art. One such method is to cover the substrate 12 with a continuous sheet of metal foil having a thermo-adhesive backing, and then utilize a die stamping technique to simultaneously shear out and bond portions of the foil to the substrate. A second method, long known in the prior art, is the etching technique, where a metal foil is bonded to a substrate, and a resist material is applied over the foil. Through a photographic or screen print process, the resist material remains only over the foil portions which are to become the circuit elements. Then the exposed foil portions are subjected to the action of an etching solution to remove the exposed foil portions, with the remaining foil portions forming the circuit elements.

The method of the present invention will now be described in terms of making one through hole connection, it being understood that in a mass production operation, many such connections would be made simultaneously. The first step in the method of the first embodiment of the present invention is to form a through hole in the board 10 at each location where it is desired to make an electrical connection between the circuit elements on opposite sides of the substrate 12. Thus, as can be seen in FIG. 1, a hole 22 is drilled or otherwise formed through the two circuit elements 18 and 20 and through the substrate 12.

With reference to FIG. 2, the next step is to apply a sensitizing film to the surface area of the board 10. This is conveniently accomplished by simply immersing the board 10 in an appropriate sensitizing solution, such as one of those disclosed in the book, "Printed Circuits Handbook," by Clyde F. Coombs, Jr., McGraw-Hill Book Co.

As will be disclosed more fully hereinafter, in this embodiment it is only necessary to sensitize the wall surfaces of the holes 22. However, the most convenient way of accomplishing this is simply to sensitize all exposed surface areas of the board 10. This sensitizing film is indicated at 24.

The next step in the method of this first embodiment is, as illustrated in FIG. 3, to apply a coating of a plating resist material over the entire upper and lower planar surfaces 14 and 16 of the board 10. This can conveniently be accomplished by roller coating both sides of the board 10 with a liquid plating resist material, such as described in the aforementioned book, "Printed Circuits Handbook."

The board is then baked or dried for a short period of time (e.g. at 120° F for 10 minutes) to form an upper and lower solid resist coating 26. It should be noted that the upper and lower plating resist coatings 26 cover the planar surfaces of the exposed surface portions 14 and 16 of the substrate 12, as well as the exposed surface portions of the circuit elements 18 and 20, with no plating resist being inserted into the holes 22.

With reference to FIG. 4, subsequent to the application of the plating resist 26, those portions 28 of the upper and lower circuit elements 18 and 20 that are peripherally adjacent the hole 22 are depressed downwardly and upwardly, respectively, from the plane of the upper and lower surfaces 14 and 16 of the board 10 into the hole area 22. This also depresses the substrate material immediately beneath, as at 30. In the same operation, the portions of the resist coating covering the depressed circuit element portions 28 are removed so that the surfaces of the peripheral circuit portions 28 are exposed. This can conveniently be accomplished by means of a flared tool, indicated schematically at 32, which is pushed downwardly into the top of the hole 22 with adequate pressure, and possibly with rotational movement sufficient to remove the resist material 26 covering the portions 28. A similar operation is performed at the lower end of the hole 22 to press the peripheral hole portion 28 of the lower element 20 upwardly into the hole 22, and also to remove the resist material that was previously deposited thereon.

At this particular stage of the process, it should be noted that the upper and lower resist coatings 26 cover the entire upper and lower planar surfaces of the board 10, with only the walls of the various holes 22 exposed, along with the adjacent depressed peripheral portions 28 of the circuit elements 18 and 20. Next, the board 10 is subjected to an electroless plating process so that conductive material is deposited on the surfaces of each hole 22 and the adjacent surfaces of the depressed circuit portions 28. This electroless plating process can be accomplished according to prior art methods described in "Printed Circuits Handbook."

The coating resist 26 prevents deposit of conductive material on the other portions of the board 10. With reference to FIG. 5, it can be seen that the material deposited in the hole 22 (this material being designated 34) has a cylindrical configuration with upper and lower flared portions 36 and 38, respectively, which overlap the upper and lower peripheral circuit element portions 28, thus ensuring good electrical connection between the through hole connector 34 and the upper and lower circuit elements 18 and 20.

At this stage of the process, an optional step is to electrolessly plate or deposit about one ten thousandths of an inch of immersion tin over the copper to improve shelf life and also to facilitate possible subsequent soldering in the through hole connection.

Next the plating resist material 26 is removed by use of a solvent, to leave the finished circuit board with the through hole connections in the circuit board being properly completed. As is customary in the prior art, the finished circuit board can be cleaned with a suitable liquid cleaner and then dried.

The second embodiment of the method of the present invention will now be described with reference to FIGS. 7 through 12. In describing this second embodiment, components corresponding to components in the first embodiment will be given like numerical designations, with a *a* suffix distinguishing those of the second embodiment.

As in the first embodiment, there is provided a circuit board 10a, made up of a dielectric substrate 12a and having upper and lower planar surfaces 14a and 16a, respectively, to which are bonded a plurality of circuit elements, one upper circuit elememt being shown at 18a and a lower circuit element being shown at 20a. As in the first embodiment, the first step in the method of the second embodiment is to form a through hole in the board 10a at each location where it is desired to make an electrical connection between the circuit elements on opposite sides of the substrate 12a. This hole is designated 22a in FIGS. 7 through 12.

Figure 8:
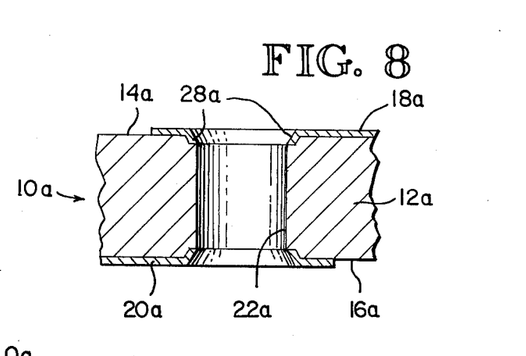
Figure 9:
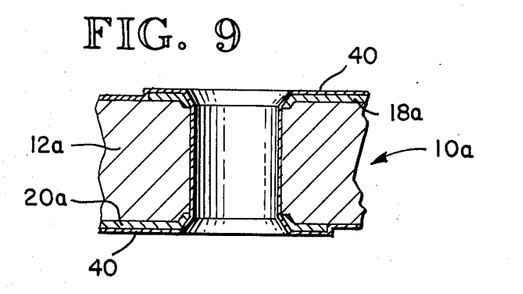

After the formation of the hole 22a, the peripheral portions 28a of the upper and lower circuit elements 18a and 20a surrounding the hole 22a are depressed downwardly and upwardly, respectively, from the plane of their respective surfaces 14a and 16a into the hole area 22a, as in FIG. 8, in much the same manner as illustrated in FIG. 4 with reference to the first embodiment. With reference to FIG. 9, the next step is to apply a sensitizing film to the entire surface area of the board 10a. As in the first embodiment, this is accomplished by simply immersing the board 10a in an appropriate sensitizing solution. However, in contrast to the first embodiment, it is necessary in this second embodiment that substantially the entire surface area of the board 10a (including the exposed surface areas of the elements 18a and 20a, the planar surfaces 14a and 16a of the substrate 12a, and the surfaces of the various holes 22a) be sensitized.

After the sensitizing step, the entire exposed surface areas of the board are electrolessly plated. This is accomplished by immersing the entire board in an electroless plating solution as described above, for a short period of time. This results in placing a very thin film of conductive material (e.g. 20 to 30 millionths of an inch thick of copper plate) over the entire surface area of the board 10a. This film is designated 40.

Figure 10:
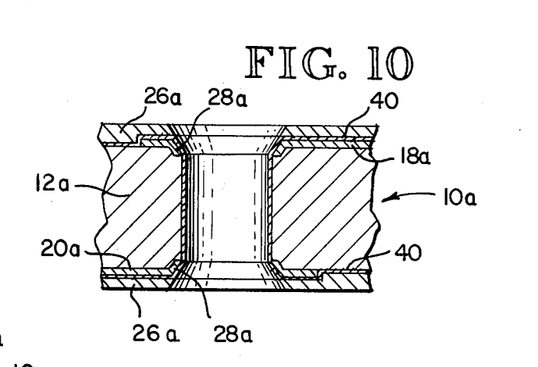

Next, with reference to FIG. 10, a coating of a plating resist material 26a is applied over the entire upper and lower planar surfaces 14a and 16a of the board 10a. This is accomplished in substantially the same manner as in the first embodiment. However, it should be noted that the resist material does not coat the surface of the hole 22a nor the peripheral depressed portion 28a of the circuit elements 18a and 20a. In the event that some of the resist does flow to a moderate extent to cover all or part of the circuit portions 28a, a flared tool, such as the tool 30 described previously herein, can be again applied to the upper and lower areas of the hole 22a to remove the resist material that might have flowed onto the surfaces of the circuit portions 28a.

Figure 11:
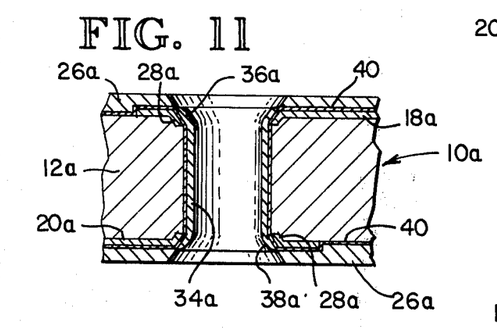

Subsequent to the application of the resist coating 26a, the board 10a is subjected to an electrolytic plating process by which copper is deposited on the exposed conductive surfaces of the board 10a, as described in "Printed Circuits Handbook". Thus, as shown in FIG. 11, the conductive material is deposited at 34a in the hole 22a and at 36a and 38a on the upper and lower flared portions of the hole 22a, so as to overlap the upper and lower peripheral circuit element portions 28a.

After the electrolytic plating is accomplished, the upper and lower coatings 26a are removed from the board 10a. The board 10a is subjected to a very short period of etching to remove those portions of the electrolessly plated conductive film 40 that remain on the board 10a on those portions of the upper and lower surfaces 14a and 16a where there are no circuit elements as those shown at 18a and 20a. This is conveniently accomplished by immersing the entire board in a suitable etching solution.

Figure 12:
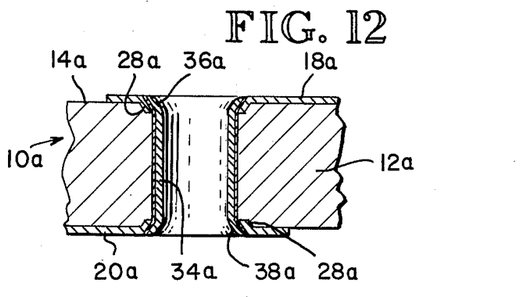

Thus, as can be seen in FIG. 12, the finished circuit board has upper and lower circuit elements 18a and 20a interconnected by a continuous plating material which extends entirely through the hole 22a in a cylindrical configuration, as at 34a, with upper and lower flared portions 36a and 38a that overlap adjacent circuit element portions 28a.

The third embodiment of the method of the present invention will now be described with reference to FIGS. 13–18. In describing this third embodiment, components corresponding to components in the first embodiment will be given like numerical designations, with a b suffix distinguishing those of the third embodiment.

Figures 13, 14, 15, 16, 17, 18:
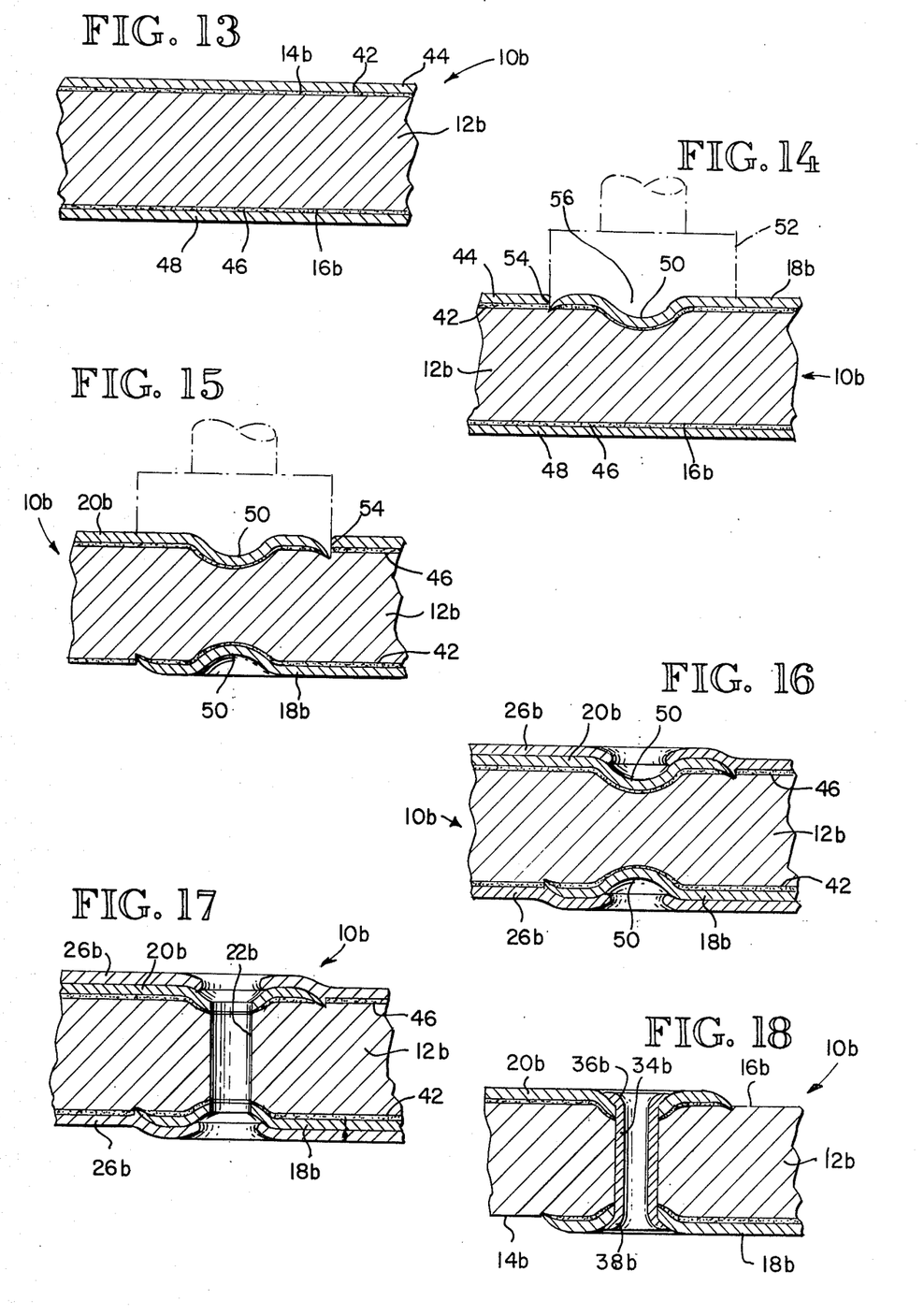
FIGS. 13–18 are a third set of views, similar to the first two sets, showing a sequence of steps in a third embodiment of the present invention.

In FIG. 13, there is shown a dielectric substrate 12b having upper and lower planar surfaces 14b and 16b. On the upper surface 14b, there is a thin layer of a thermo-plastic adhesive 42, above which is a sheet 44 of a conductive foil. In a similar fashion, there is also provided a second layer of a thermo-plastic adhesive 46 and a second sheet of conductive foil 48 for the lower surface 16b of the substrate 12b. In the configuration of FIG. 13, the circuit elements have not as yet been formed on the substrate 18b.

In FIG. 14, there is shown a step by which an upper circuit element 18b is sheared from the upper foil 44 and bonded to the substrate 12b. Simultaneously with this cutting and bonding action, the foil sheet 44 is depressed into the substrate 12b at a location where it is desired to make a through hole connection, this depression being indicated at 50. The manner in which a circuit element is sheared or cut from a foil sheet and simultaneously bonded to a substrate is described in detail in my pending application Ser. No. 402,816, entitled "A Circuit Board, Method Of Making The Circuit Board And Improved Die For Making Said Board," filed Oct. 7, 1973, so this will not be described in detail herein. However, this is shown schematically in FIG. 14.

In FIG. 14 there is shown a portion of a die 52 having a cutting edge 54 with a configuration corresponding to the edge portions of the circuit element 14b which it is forming. For convenience of illustration, only a portion of the cutting edge 54 is shown in FIG. 14. The die 52 is also provided with a rounded protrusion 56 by which the depression 50 is formed. This die 52 is heated and pressed against the sheet 44 to simultaneously shear out or cut out the circuit element 18b and bond the element 18b to the substrate 12b by heating the underlying thermoplastic adhesive 42 to the temperature at which adhesion occurs, and also forming the depression 50. It is to be understood that such a die 52 generally is formed with a plurality of cutting elements so that a number of circuit elements are formed simultaneously with one stamping action.

In FIG. 15, there is shown an operation similar to that of FIG. 14, with a circuit element 20b being formed on the opposite side of the substrate 12b. As with the circuit element 18b, there is a depression formed at 50 at the location of the element 20b where the through hole connection is to be made. At the completion of the steps shown in FIGS. 14 and 15, there is formed a circuit board 10b having upper and lower circuit elements 18b and 20b. This circuit board 10b differs from those of the first two embodiments in that the counter-sink-like recesses (in the form of the depressions 50) in the two circuit elements 18b and 20b have already been formed prior to the formation of the hole through which the electrical connection is to be made between the two elements 18b and 20b.

Next, a sensitizing solution is applied to the entire circuit board 10b, after which a resist coating is applied over the entire upper and lower surfaces of the circuit board 10b, these two resist coatings being designated 26b in FIG. 16. These resist coatings 26b are applied (e.g. by roller coating) in a manner that the depression portions 50 of the two circuit elements 18b and 20b are not covered with the resist coating.

Subsequent to the application of the resist coatings 26b, as shown in FIG. 17, a through hole 22b is drilled or otherwise formed through the circuit board 10b at the location of the two depressions 50. This hole 22b has a diameter moderately smaller than the two depressed portions 50 of the circuit elements 18b and 20b, to leave upper and lower annular depressed circuit element portions 28b, which are not covered by the two resist coatings 26b. Then the circuit board 10b is subjected to an electroless plating process, as in the previous embodiments, to form a deposit of conductive material 34b in the hole 22b, this conductive material 34b having upper and lower flared portions 36b and 38b, respectively, which overlap the upper and lower peripheral circuit element portions 28b. Subsequent to this, the resist coatings 26b are removed to leave the circuit board 10b formed with the through hole connection, as shown in FIG. 18.

In FIGS. 19–22, there is shown a fourth embodiment of the present invention, which is essentially a modification of the third embodiment shown in FIGS. 13–18. Components of this fourth embodiment corresponding to those in previous embodiments will be given like numerical designations, with a c suffix distinguishing those of this fourth embodiment.

Figure 19:
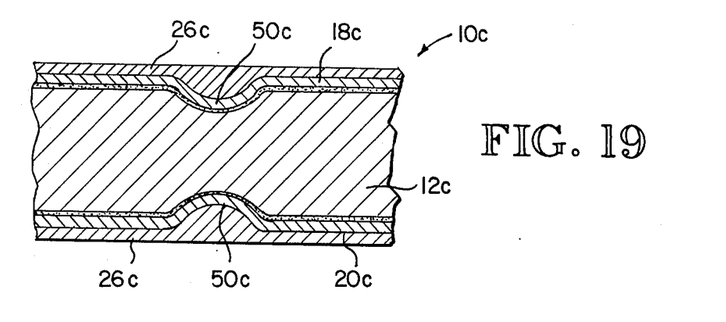
FIGS. 19–22 are a fourth set of views, similar to the previous sets, showing a fourth embodiment of the present invention.

In FIG. 19, there is shown a circuit board 10c made up of a substrate 12c having upper and lower circuit elements 18c and 20c formed thereon. Each of these circuit elements 18c and 20c has a depressed portion 50c at the area where a through connection is to be made between the elements 18c and 20c. Subsequent to the formation of the circuit elements 18c and 20c and of the depressions 50c, a resist coating 26c is applied to the upper and lower surfaces of the circuit board 10c. However, unlike the third embodiment, the resist coatings 26c are applied to cover the entire upper and lower surfaces, including the depressed portions 56c of the circuit elements 18c and 20c.

Figure 20:
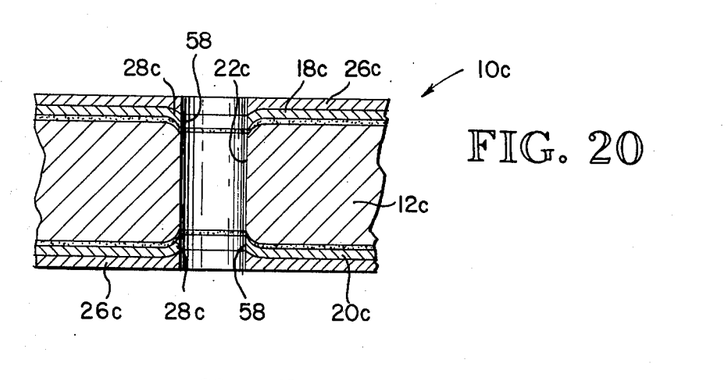

Subsequent to the application of the resist coatings 26c, a through hole 22c is formed at the location of the two circuit element depressions 50c. (This is shown in FIG. 20.) As in the third embodiment, the diameter of the hole 22c is moderately smaller than the diameter of the two depressions 56c. Thus, in forming this hole 22c, each of the circuit elements 18c and 20c is left with an inwardly slanting portion 28c adjacent the hole 22c, with each inwardly slanting circuit element portions 28c having an exposed cylindrical surface 58.

Figure 21:
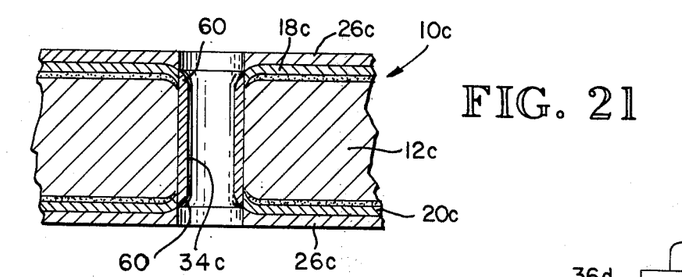

Next, the circuit board 10c is weakly activated so that the surface of the hole 22c and the exposed circuit element portions 28c are activated to be electrolessly plated, without activating the resist coatings 26c sufficiently to become electrolessly plated. The board 10c is then subjected to an electroless plating process to deposit conductive material, as at 34c, in the hole 22c.

Figure 22:
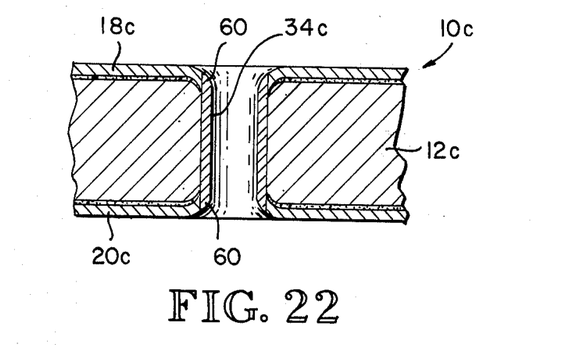

This deposit of conductive material 34c has upper and lower edge portions 60 which overlap the exposed surface portions 58 of the circuit elements 18c and 20c so as to make electrical connection therewith. Subsequent to this deposition of material 34c, as shown in FIG. 22, the two resist coatings 26c are removed. As can be seen in FIG. 22, electrical connection is made to each of the circuit elements 18c and 20c at locations spaced just inwardly of the upper and lower surface of the board 10c.

Figure 23:
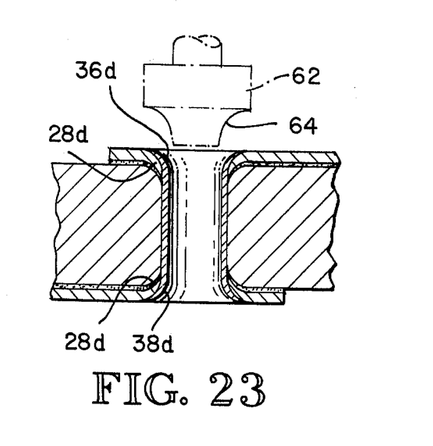
FIG. 23 is a view similar to FIG. 6, illustrating a modified configuration of the through hole connection, and indicating in dotted lines a tool used to make such a configuration.

FIG. 23 shows a modified configuration of the flaring tool shown in FIG. 4. This modified flaring tool, indicated at 62 has its contact surface 64 concavely curved, as seen in longitudinal section. Thus, the circuit element portions 28d that are depressed into the hole 22d are convexly curved, and in like manner the overlapping circuit element portions 36d and 38d are also convexly curved, rather than conically shaped, as seen in FIG. 4.

Figure 24:
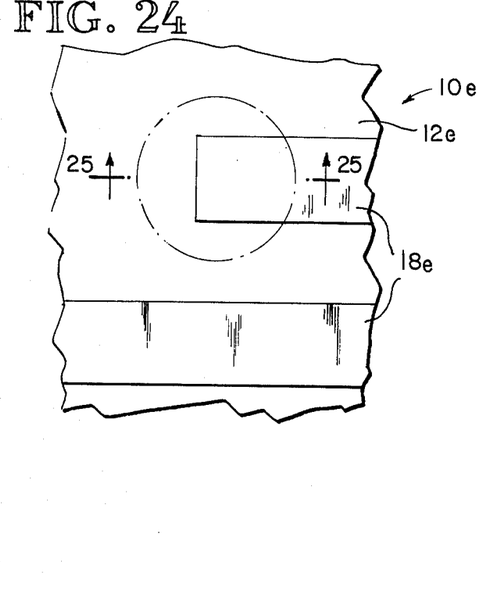
FIGS. 24–26 are views similar to FIGS. 1A and 1–6, illustrating a fifth embodiment of the present invention.

The fifth embodiment of the present invention will now be described with reference to FIGS. 24–26. As in the prior embodiments, there is a circuit board 10e comprising a substrate 12e with upper and lower circuit elements 18e and 20e. Two upper circuit elements 18e are shown in FIG. 24, and it will be noted that each of these elements 18e is an elongate strip of quite narrow width, positioned very close to one another. In the prior art, it is quite common to form a circuit element with a "pad" wider than the width of the circuit element, so that when an electrical component is mounted in the area of the pad, there is sufficient contact surface for adequate electrical conductivity. However, in the arrangement shown in FIG. 24, the close proximity of the two narrow circuit elements 18e prohibit the use of a pad of expanded width.

Figure 25:
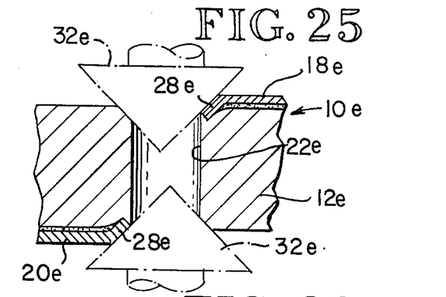
Figure 26:
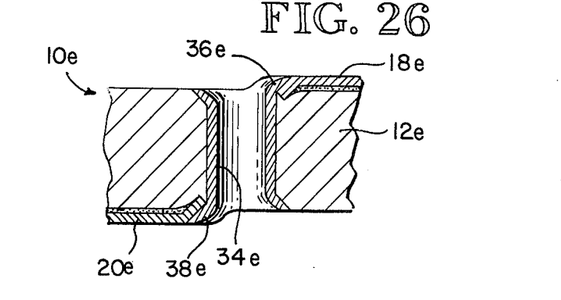

The process shown in FIGS. 24–26 is substantially the same as that shown in FIGS. 1–6, except that the through hole 22e formed through the circuit board 10e is wider than the upper and lower circuit elements 18e and 20e between which the connection is to be made. Thus, as can be seen in FIG. 25, when the circuit element portions 28e are depressed into the hole 22e, as by the countersink tools 32e, such circuit portions 28e extend only into a portion of the periphery of the hole 22e. As viewed in FIG. 25, the upper circuit element portion 28e extends into the upper right hand portion of the hole 22e, while the lower circuit element portion 28e extends into the lower left hand portion thereof.

Subsequent to the formation of the two depressed circuit element portions 28e, the circuit board is subjected to a plating process as described in the description of the first embodiment earlier herein. This results in a deposit of conductive material 34e with upper and lower overlapping portions 36e and 38e, respectively. Since these connecting portions 36e and 38e have an area of overlapping contact with the depressed circuit element portions 28e, there is sufficient overlapping area to provide good electrical connection between the circuit elements 18e and 20e. The peripheral edge of the countersink at the upper surface of the board 10c is indicated with a broken line at 68 in FIG. 24.

Figure 27:
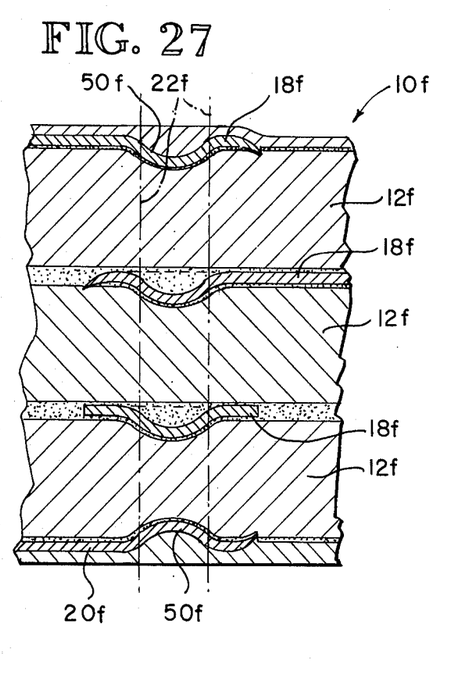
FIG. 27 is a sectional view of a multi-layer circuit board, generally made in accordance with the process disclosed in FIGS. 14–18.

FIG. 27 illustrates a multi-layer circuit board in which a through hole connection is made between four circuit elements positioned in vertical alignment. Since substantially the same process is employed as described with reference to the fourth embodiment shown in FIGS. 19–22, the method forming the connection in this multi-layer circuit board will be described only briefly herein. Numerical designations corresponding to the earlier embodiments are applied, with a f suffix distinguishing those in FIG. 27.

In FIG. 27, there are shown three layers of substrate 12f stacked one on top of the other. The upper two substrates 12f have circuit elements 18f formed only on the upper surfaces thereof, while the bottom substrate 12f has circuit elements formed on both surfaces, these elements being designated 18f and 20f. The formation of a through hole is indicated schematically by dotted lines at 22f, and the formation of the through hole connection is performed in substantially the same manner as described previously herein and illustrated in FIGS. 21 and 22.

Figure 28:
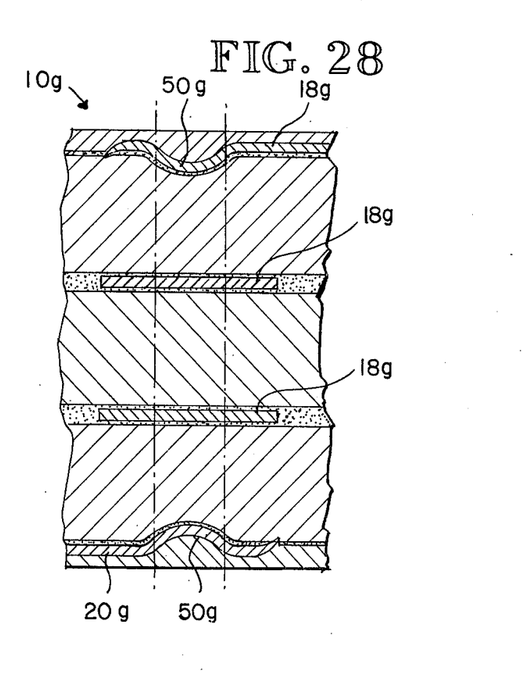
FIG. 28 is a sectional view of a multi-layer circuit board made similarly to that of FIG. 27, but in a modified form.

FIG. 28 shows a modified form of a multi-layer circuit board. The various elements in this board that correspond to the board shown in FIG. 27 are given like numerical designations, with a g suffix distinguishing those of the board shown in FIG. 28.

The essential difference in the board shown in FIG. 28 is that the circuit elements 18g positioned between dielectric substrates 12g do not have depressed portions, but are left as flat circuit elements. Thus, only the uppermost circuit element 18g and the lowermost circuit element 20g are formed with depressed portions 50g. The through hole connections is accomplished in substantially the same manner as with the circuit board shown in FIG. 27, and that shown in FIGS. 19–22.

EXAMPLE

A plurality of circuit elements were formed on the upper and lower surfaces of a dielectric substrate by a prior art die stamping process. The circuit elements were made of copper 0.00135 inch thick, and the substrate was made of glass epoxy laminate, 0.0625 inch thick. Holes were drilled through the circuit board at the locations where it was desired to make hole connections. The circuit board was then dipped into a sensitizing solution for five minutes, withdrawn from the solution, and permitted to dry.

Next, a plating resist material was applied to the upper and lower planar surfaces of the board by roller coating. The peripheral portions of the circuit element adjacent each drilled hole were depressed into the area of the hole by pushing a flared tool into the upper and lower peripheral portions of each hole and rotating the same. This formed a countersink-like depression in the upper and lower ends of each hole, and also removed the resist material from the circuit portions that were depressed into the hole areas.

Then the circuit board was dipped into an electroless plating solution for a period of 6 to 10 hours to cause a deposit of copper in each of the hole areas approximately 0.0014 inch thick. The copper so deposited coated the entire hole area, and also overlapped the depressed peripheral portions of each of the circuit elements so as to make an overlapping electrical connection with the circuit elements at each hole area.

What is claimed is:

1. In a circuit board having generally planar first and second surfaces and comprising a substrate, a first circuit element on one side of the substrate, and a second circuit element on the opposite side of the substrate,
  a method of making a connection from one circuit element to the other through the substrate, said method comprising:

a. providing in the circuit board a through hole extending through both circuit elements and through the substrate,
b. forming portions of the first and second circuit elements adjacent said hole from the planes of, respectively, the first and second surfaces into the hole to make first and second inwardly flared circuit element portions, and covering the first and second planar surfaces of the board with a substantially uniform plating resist material, while providing as exposed areas the inwardly flared circuit element portions and the hole area therebetween exposed, and
c. plating the exposed areas of the board to form a through hole connection having a middle portion extending through the hole and two end portions overlapping the two inwardly flared circuit element portions.

2. The method as recited in claim 1, wherein the plating resist is applied to the first and second planar surfaces of the board prior to forming the inwardly flared circuit element portions, and said inwardly flared circuit element portions are formed by pressing the circuit element portions adjacent the hole into the hole and removing the plating resist from said circuit element portions.

3. The method as recited in claim 1, wherein a tool having a flared forming surface is pressed against said circuit element portions to depress them from the planes of the circuit board.

4. The method as recited in claim 3, wherein said tool is rotated in addition to being pressed into the board so as to remove resist material from the inwardly flared circuit portions.

5. The method as recited in claim 1, wherein a sensitized coating is applied to exposed areas of the circuit board subsequent to forming said through hole and prior to applying the resist coating, and the plating is accomplished by electrolessly plating to form the through hole connection.

6. The method as recited in claim 1, wherein said resist coating is applied uniformly over substantially the entire first and second planar surfaces of said board.

7. The method as recited in claim 6, wherein said resist coating is applied to said first and second surfaces by roller coating a liquid resist material thereon and causing the applied coating to harden.

8. The method as recited in claim 1, wherein said first and second circuit element portions adjacent the hole are first pressed into the hole to make the first and second inwardly flared circuit element portions, after which the plating resist material is applied to the first and second planar surfaces while leaving the inwardly flared circuit element portions exposed.

9. The method as recited in claim 1, wherein prior to applying said plating resist material, and after said through hole is formed, a thin conductive coating is applied to the exposed surface areas of the board, and said through hole connection is made by electrolytically plating said through hole and the two inwardly flared circuit element portions.

10. The method as recited in claim 9, wherein said thin conductive coating is applied by first applying a sensitizing coating to exposed areas of the board and then electrolessly plating said sensitized surface.

11. The method as recited in claim 1, wherein after said hole is formed and prior to applying the resist material, a sensitizing coating is applied to the exposed surface areas of the board, a thin conductive coating is electrolessly plated on the exposed surface areas of the board, and the first and second circuit element portions are formed into the hole area, and subsequent to applying the resist coatings to the board, the exposed hole area and the two inwardly flared circuit element portions are electrolytically plated to form the through hole connection.

12. The method as described in claim 1, wherein said flared circuit element portions are provided by depressing a part of each of the first and second circuit elements into the substrate at the location where the through hole connection is to be made, and then forming the through hole so as to provide the inwardly flared circuit element portions surrounding the hole.

13. The method as recited in claim 14, wherein simultaneously with the depressing of a circuit element part into the substrate, said circuit element is formed by pressing a stamping die against a conductive sheet overlying said substrate.

14. The method as recited in claim 13, wherein the forming of the foil element and forming of the depressed circuit element part is accomplished by engaging said conductive sheet with a die having a cutting edge to form the circuit element and a protruding portion to depress the circuit element part into the substrate.

15. The method as recited in claim 12, wherein after forming said depressed parts into the circuit elements, the resist material is applied to upper and lower surfaces of the circuit board, while leaving said depressed parts of the circuit elements exposed.

16. The method as recited in claim 12, wherein subsequent to the forming of the depressed circuit element parts, the resist material is applied so as to cover the entire upper and lower surfaces of the circuit board, including covering the depressed circuit element parts.

17. The method as recited in claim 16, wherein subsequent to applying the resist material, said through hole is formed so as to leave exposed side surfaces of the first and second inwardly flared circuit element portions to which electrical connection is made by subsequenting plating.

18. The method as recited in claim 1, wherein said inwardly flared circuit element portions are formed by applying a generally cone-shaped tool so as to form conically shaped circuit element portions.

19. The method as recited in claim 1, wherein said first and second inwardly flared circuit element portions are formed by a tool having a convexly curved surface, so as to form concavely rounded inwardly flared circuit element portions.

20. The method as recited in claim 1, wherein said through hole is formed with a diameter at least as large as the width dimension of at least one of said circuit elements, so that the inwardly flared circuit element portion of that element is formed only in a portion of said through hole.

21. The method as recited in claim 1, wherein said circuit board is a multi-layer circuit board, with a plurality of substrates stacked one on top of the other, and with a plurality of individual circuit elements vertically aligned, and said through hole is formed through said substrates and said elements to make an electrical connection between said elements.

22. In a circuit board having first and second surfaces and comprising a substrate, a first circuit element on one side of the substrate, and a second circuit element on the opposite side of the substrate, a method of making a connection from one circuit element to the other through the substrate, said method comprising:
a. providing in the circuit board a through hole extending through both circuit elements and through the substrate,
b. applying a sensitizing coating to exposed surface areas of the board,
c. applying a resist material to the first and second planar surfaces of the board,
d. pressing portions of the first and second circuit elements adjacent said hole from the planes of, respectively, the first and second board surfaces into the hole to make first and second inwardly flared circuit element portions, and removing resist material from said inwardly flared circuit portions, and
e. electrolessly plating exposed areas of the board to form a through hole connection having a middle portion extending through the hole and two end portions overlapping and connecting to the inwardly flared circuit element portions.

23. In a circuit board having first and second surfaces and comprising a substrate, a first circuit element on one side of the substrate, and a second circuit element on the opposite side of the substrate, a method of making a connection from one circuit element to the second circuit element through the substrate, said method comprising:
a. providing in the circuit board a through hole extending through both circuit elements and through the substrate,
b. pressing portions of the first and second circuit elements adjacent said hole from the planes of, respectively, the first and second surfaces, into the hole to make first and second inwardly flared circuit element portions.
c. applying a sensitizing coating to exposed surface areas of the board,
d. electrolessly plating the exposed surface areas of the board,
e. applying a plating resist material to the first and second planar surfaces of the board to leave the hole area and the inwardly flared circuit element portions exposed, and
f. electrolytically plating the exposed surface area to form a through hole connection having a middle portion extending through the hole and two end portions overlapping and connecting electrically to the inwardly flared circuit element portions.

* * * * *